(12) United States Patent
Rahimo

(10) Patent No.: US 7,989,878 B2
(45) Date of Patent: Aug. 2, 2011

(54) CATHODE CELL DESIGN

(75) Inventor: Munaf Rahimo, Uezwil (CH)

(73) Assignee: ABB Schweiz AG, Baden (CH)

( * ) Notice: Subject to any disclaimer, the term of this patent is extended or adjusted under 35 U.S.C. 154(b) by 205 days.

(21) Appl. No.: 11/979,454

(22) Filed: Nov. 2, 2007

(65) Prior Publication Data

US 2008/0087947 A1   Apr. 17, 2008

Related U.S. Application Data

(63) Continuation of application No. PCT/CH2006/000262, filed on May 18, 2006.

(30) Foreign Application Priority Data

May 24, 2005   (EP) .................................... 05011178

(51) Int. Cl.
*H01L 29/76* (2006.01)
*H01L 21/336* (2006.01)
(52) U.S. Cl. ........................................ 257/328; 438/268
(58) Field of Classification Search .................. 257/213, 257/288, 327, 335, 339, 328, 341, 342, 346, 257/368, 378; 438/268
See application file for complete search history.

(56) References Cited

U.S. PATENT DOCUMENTS

| | | | | |
|---|---|---|---|---|
| 5,023,678 A | * | 6/1991 | Kinzer ........................... | 257/339 |
| 5,286,984 A | * | 2/1994 | Nakagawa et al. ........... | 257/139 |
| 5,945,692 A | * | 8/1999 | Yano et al. .................... | 257/139 |
| 6,025,622 A | * | 2/2000 | Nakagawa et al. ........... | 257/298 |
| 6,133,607 A | * | 10/2000 | Funaki et al. .................. | 257/343 |
| 6,147,381 A | * | 11/2000 | Hirler et al. .................... | 257/328 |
| 6,207,993 B1 | * | 3/2001 | Ishimura et al. ............... | 257/335 |
| 6,784,513 B2 | * | 8/2004 | Aki et al. ....................... | 257/462 |
| 6,831,345 B2 | * | 12/2004 | Kinoshita et al. ............. | 257/492 |
| 6,894,319 B2 | * | 5/2005 | Kobayashi et al. ........... | 257/135 |
| 6,911,692 B2 | * | 6/2005 | Kobayashi et al. ........... | 257/329 |
| 6,943,410 B2 | * | 9/2005 | Fujihira et al. ................ | 257/339 |
| 7,049,675 B2 | * | 5/2006 | Kinoshita et al. ............. | 257/492 |
| 2004/0256691 A1 | * | 12/2004 | Nemoto et al. ................ | 257/491 |

FOREIGN PATENT DOCUMENTS

| | | |
|---|---|---|
| EP | 0 837 508 A2 | 4/1998 |
| WO | 98/38681 A1 | 9/1998 |

OTHER PUBLICATIONS

*PCT/ISA/210.
*PCT/ISA/237.
*EPO Form 1507 0.

* cited by examiner

*Primary Examiner* — Leonardo Andújar
*Assistant Examiner* — Jordan Klein
(74) *Attorney, Agent, or Firm* — Buchanan Ingersoll & Rooney PC

(57) ABSTRACT

An n-channel insulated gate semiconductor device with an active cell (5) comprising a p channel well region (6) surrounded by an n type third layer (8), the device further comprising additional well regions (11) formed adjacent to the channel well region (6) outside the active semiconductor cell (5) has enhanced safe operating are capability. The additional well regions (11) outside the active cell (5) do not affect the active cell design in terms of cell pitch, i.e. the design rules for cell spacing, and hole drainage between the cells, hence resulting in optimum carrier profile at the emitter side for low on-state losses.

15 Claims, 4 Drawing Sheets

Prior Art  FIG. 1

CATHODE CELL DESIGN

FIELD OF THE INVENTION

The invention relates to the field of high voltage power semiconductor devices. It relates to a power insulated gate semiconductor device according to the preamble of independent claims.

BACKGROUND OF THE INVENTION

The safe operating area (SOA) of a power semiconductor device is a graphical representation of the maximum operational voltage and current limits of the device subjected to various constraints. The forward bias safe operating area (FB-SOA) and the reverse bias safe operating area (RBSOA) represent the device SOA with the gate-emitter forward biased or reverse biased, respectively.

For high voltage devices, the RBSOA becomes more critical due to the low n-base doping levels and associated dynamic avalanche, which will occur at lower current densities. Also, such devices will experience much harsher SOA conditions at high DC link voltages during testing and operation.

Standard planar Insulated-Gate Bipolar Transistor (IGBT) cathode cell designs are normally designed for a high SOA by increasing the latch-up immunity of the n+ source regions. For high voltage IGBTs, this has normally been achieved with the addition of highly doped p+ well regions in the active cell region. However, it is well known that the standard approach mentioned above will not fulfil the SOA requirements especially when designing IGBTs with ratings ranging from 2000 V up to 8000 V. In addition, there is a design trade-off between improved safe operating area using additional p+ well regions and reduced on-state losses for the high voltage IGBT.

U.S. Pat. No. 6,025,622 shows a MOSFET with such a p+ well region in the active cell region. Further p+ guard rings surround the region around the base layers, source layers and the high resistance region under the gate electrode. These p+ guard rings are floating without a contact to the source electrode. They are used as a junction termination to assure high withstand voltage.

As described in EP 0 837 508 A2, for a planar IGBT with low on-state losses, a p doped channel well region is surrounded by an n type layer which acts as a hole barrier region. This will increase the latch-up current during device turn-off. However for high voltage IGBTs with ratings exceeding 2000 V, such an IGBT has shown not to be effective for increasing the SOA capability sufficiently. Such an IGBT planar cell layout and cross section design is shown in FIG. 1.

DESCRIPTION OF THE INVENTION

It is an object of the invention to provide a power insulated gate semiconductor device of the initially mentioned kind with an increased SOA (safe operating area) and low on-state losses.

This object is achieved by an IGBT according to the independent claims.

An insulated gate semiconductor device according to the invention comprises a first layer of a first conductivity type with an upper side. Insulated gate electrodes are formed on the upper side. The semiconductor device further comprising an active semiconductor cell, which comprises
 a part of the first layer and
 a channel well region of the second conductivity type,
 source regions of the first conductivity type having a doping density higher than said first layer,
 a third layer of the first conductivity type having a doping density higher than the first layer, and lower than the doping density of the source regions, and
 emitter electrodes which are formed on the upper side and contact the source regions and the channel well regions.

The channel well region, the source regions and the third layer are formed within the first layer adjacent to the upper side. The third layer at least partially separates the channel well region and the first layer.

At least one of the following features or any combination thereof applies:
 The semiconductor device further comprises additional well regions of the second conductivity type which are formed adjacent to the channel well region outside the active semi conductor cell within the first layer, said additional well regions having a higher doping concentration than the channel well region and said additional well regions being electrically connected through said channel well regions to the emitter electrodes. In case of a gate electrode or a source region being formed above an additional well region then only said gate electrode or said source region is formed above the additional well region and not said gate electrode together with said source region so that no conductive channel is formed, or
 the semiconductor device has a junction between the first layer and the additional well regions which is deeper than the junction between the first layer and the channel well region, instead of additional well regions having a higher doping concentration than the semiconductor device.

In a preferred embodiment, no region of the second conductivity type with a doping density higher than the channel well region is arranged in the active cell, thus on-state losses are reduced.

The third layer in an insulated gate semiconductor device according to the invention reduces the on-state losses by having a low hole drain effect by providing a hole barrier region. The hole barrier effect in the third layer will also increase the cell latch-up immunity in the active cell regions. The additional well regions provide an avalanche point away from the active cell peripheries, and an alternative path for the holes away from the critical source regions. The additional well regions do not affect the active cell design in terms of cell pitch, i.e. the design rules for the distance between the active cells, and hole drainage between the cells, hence resulting in optimum carrier profile at the emitter side having low on-state losses.

Further advantages according to the present invention will be apparent from the dependent claims.

BRIEF DESCRIPTION OF THE DRAWINGS

The subject matter of the invention will be explained in more detail in the following text with reference to the attached drawings, in which.

DETAILED DESCRIPTION OF PREFERRED EMBODIMENTS

Figure 1:
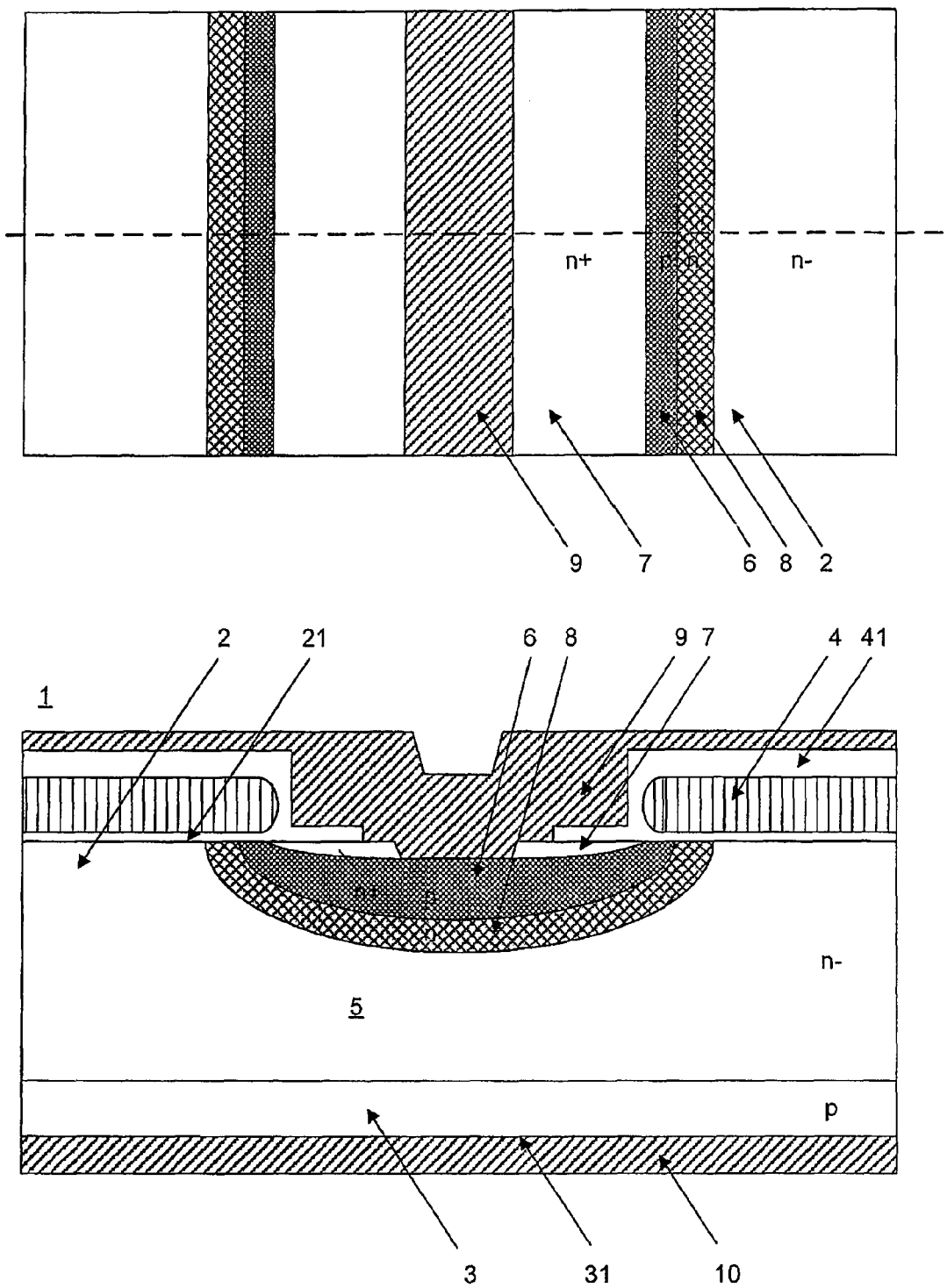
FIG. 1 shows an insulated gate semiconductor device according to the prior art.

The upper part of FIG. 1 shows a simplified top view of an IGBT device while the lower part shows a cross sectional view of a cut along the dashed line. An insulated gate semiconductor device 1 comprises a first (n−) type layer 2 and a second p type layer 3. The first layer 2 has an upper side 21 and is connected to the second layer 3 on the side opposite the upper side 21, the second layer 3 has a lower side 31 and is connected to said first layer 2 on the side being opposite the lower side 31. On the upper side 21 a gate electrode 4 is embedded in an insulation layer 41. In the semiconductor device 1 an active semiconductor cell 5 is formed, which comprises:
- a part of said first and second layer 2 and 3,
- a p type channel well region 6,
- (n+) type source regions 7 having a doping density higher than said first layer 2,
- a third n type layer 8 having a doping density higher than said first layer 2, and lower than the doping density of the source regions,
- emitter electrodes 9 which are formed on said upper side 21 and contact the source regions 7 and the channel well regions 6, and
- collector electrodes 10 which are formed on said lower side 31 and contact said second layer 3.

The channel well region 6, the source regions 7 and the third layer 8 are formed within said first layer 2 adjacent to said upper side 21, the third layer 8 separating the channel well region 6 and the remaining part of the first layer 2.

The two main electrodes, the emitter electrode 9 and collector electrode 10 are made of a conductive material, e.g. AlSi and they contact the first layer 2 on the upper side 21 or the second layer 3 on the lower side 31, respectively. The gate electrodes 4 comprise a conductive material, e.g. polysilicon and they are separated from the first layer 2, the channel well region 6 and the third layer 8 by an insulation layer 41, e.g. a low-temperature-oxide. By means of the gate electrode 4 and the source region 7 at least partially being formed above the channel well region 6 a conductive channel is formed between the first layer 2, the third layer 8, the source region 7 to the emitter electrode 9. It is possible but not necessary for the gate electrode 4 and the source region 7 to overlap.

The following figures FIG. 2 to 7 show an inventive n-channel IGBT with an n type first layer 2. It is possible to apply the invention to other insulated gate semiconductor devices like insulated gate field effect transistors (e.g. MOSFETs with an n type second layer 3 instead of the p second layer 3 in the case of IGBTs). Furthermore, it is also possible to apply the invention to p-channel insulated gate semiconductors with p type first layers, but in that case the conductivity types of all layers are reversed. Moreover, in the case of IGBTs the invention can be applied to non-punch-through IGBTs as they are shown in FIG. 2 to 7, but also to punch-through IGBTs with an (n+) type buffer layer between the first layer 2 and the second layer 3, which buffer layer has a higher doping density than the first layer 2.

Figure 2:
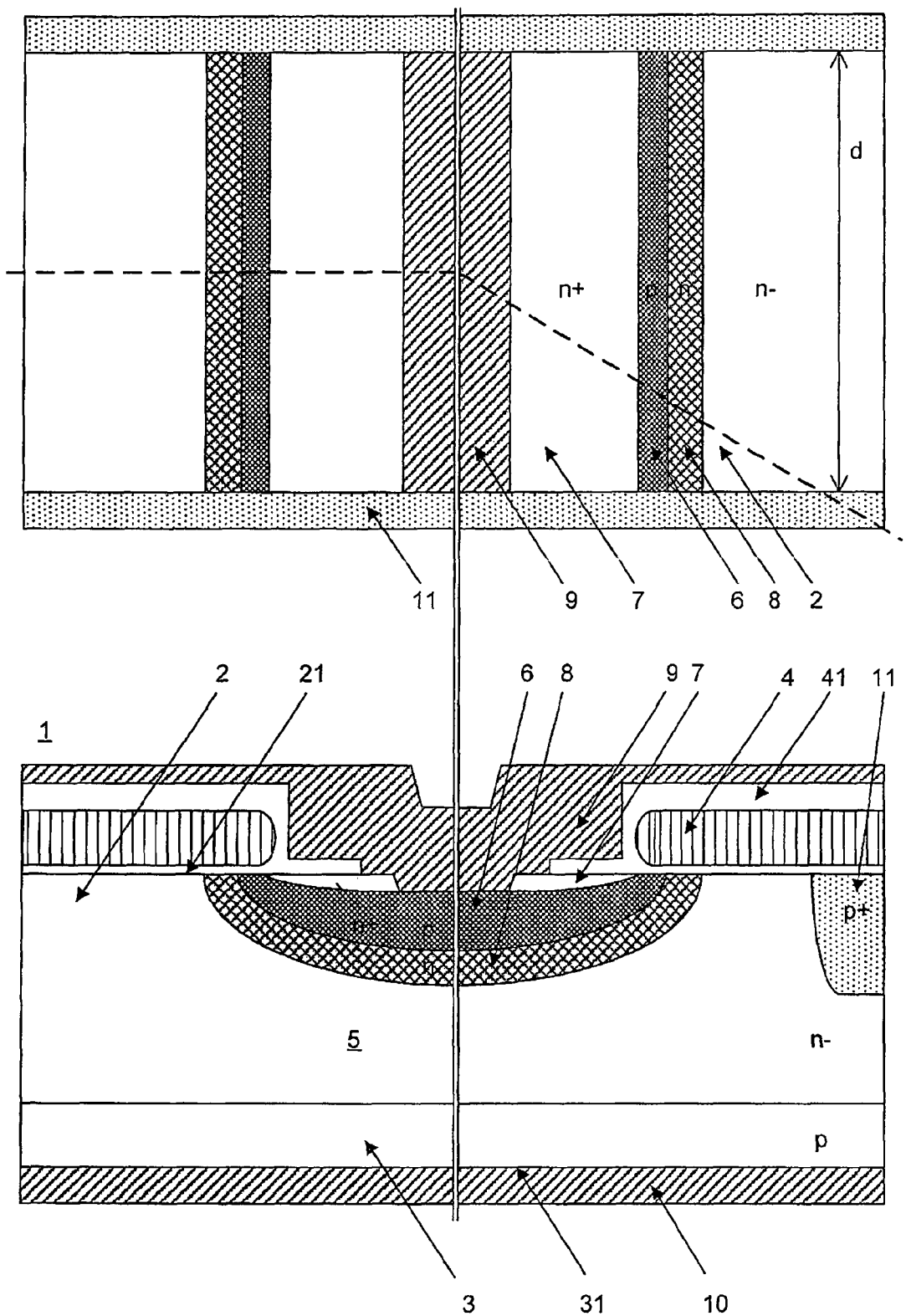
FIG. 2 shows a first embodiment of the insulated gate semiconductor device according to the invention.

FIG. 2 shows a first embodiment of the inventive insulated gate semiconductor device and a cross section through the semiconductor device cut along the dashed line. Obviously, the active cross section of the inventive IGBT shown in the left half of the lower part of FIG. 2 remains similar to the standard IGBT design shown in FIG. 1. The cross sectional view of the cut along the dashed line in the right half of FIG. 2, however, shows the newly introduced additional (p+) type well regions 11 which are formed adjacent to the channel well region 6 outside the active semiconductor cell 5 within said first layer 2. The additional well regions 11 have a higher doping density than the channel well region 6 and they are electrically connected through said channel well regions 6 to the emitter electrodes 9. In case of a gate electrode 4 or a source region 7 being formed above an additional well region 11 then only said gate electrode 4 or said source region 7 is formed above the additional well region 11 and not said gate electrode 4 together with said source region 7 so that no conductive channel is formed. That means that above an additional well region 11 either a gate electrode 4 or a source region 7 may be formed but not both of them. In FIG. 2 an example is shown in which the gate electrode 4 is formed above the additional well region 11 but no source region 7 is formed above the additional well region 11. In FIG. 2 the source region 7 is positioned lateral to the additional well region 11. Alternatively, it is also possible that above the additional well region 11 only a source region 7 is formed, but in that case no gate electrode 7 may be formed above the additional well region 11. In a further alternative, neither a gate electrode 4 nor a source region 7 is formed above the additional well region 11. In all cases no conductive channel through the additional well region 11 is formed and the additional well regions 11 in such an embodiment are only connected through the p type channel well region 6 at the end parts of the active cell 5 to the emitter electrode 9. This will result in an optimum contacting between the additional well region 11 and the channel well region 6 without affecting the standard IGBT design and electrical performance in terms of low on-state losses. In case of channel well regions 6 having the form of stripes the additional well regions 11 are arranged at the end parts of the shorter sides of the channel well regions 6. These additional well regions 11 enhance both the avalanche field effect by providing designed-in avalanche points and the hole drain effect by providing an extra path for the holes, but without having any drawbacks in terms of increased on-state losses. As the additional well regions 11 are arranged at the end parts of the active cell 5 they do not effect the active cell design in terms of a) the cell pitch (distance between two active cells) and b) hole drainage between the cells, hence resulting in optimum carrier profile at the emitter side for low on-state losses.

This principle of operation can be explained as follows: a substantial increase in the turn-off capability of the IGBT is achieved by reducing the avalanche current during turn-off in the main active cell, thus reaching the critical latch-up condition at much higher current and power levels.

In a further embodiment of the inventive semiconductor device, no region of the second conductivity type with a doping density higher than the channel well region is arranged in the active cell, thus avoiding an increase of on-state losses.

In a further embodiment of the inventive IGBT the first layer 2 typically has a thickness of about 30 μM for a voltage of 600 V and a doping density of about $2*10^{14}$ atoms/cm$^3$, the thickness rising up to 700 μm for voltage s of 8000 V and the doping density falling down to less than $1*10^{12}$ atoms/cm$^3$. The third layer 8 has a thickness of 1 to 5 μm and a doping density in the range of $1*10^{14}$ up to $1*10^{17}$ atoms/cm$^3$. The source region 7 has a thickness of 0.1 to 5 μm and a doping density higher than $1*10^{18}$ atoms/cm$^3$. The channel well region 6 has a thickness of 0.5 to 5 μm and a doping density in the range of $1*10^{16}$ up to $1*10^{18}$ atoms/cm$^3$. The additional well region 11 has a thickness of 1 to 10 μm and a doping density higher than $1*10^{16}$ atoms/cm$^3$.

FIG. 3 to FIG. 7 show a few more exemplary embodiments of the inventive IGBT design. Any deviations or combinations of these designs are also possible. For higher clarity of the figures the source regions 7 are not shown in the different embodiments of FIG. 3 to FIG. 7.

Figure 3:
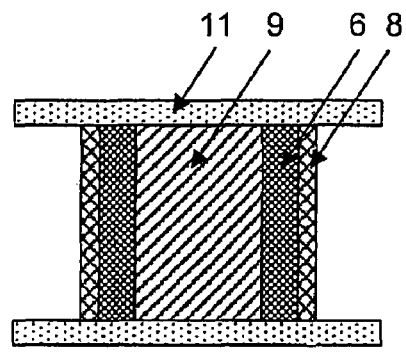
FIG. 3 to 7 show different embodiments of the inventive IGBT cell design with the new additional well regions.

FIG. 3 shows an embodiment of the invention in which additional well regions 11 are formed at the end portions of the active cell 5. The width of the additional well regions 11 is broader than the active cell 5. If two or more active cells 5 in a semiconductor device 1 are arranged in rows one common additional well region 11 can be formed on each end part of the active cells 5. This design is suitable for stripe type layout designs, which means that the channel well regions 6 have on the side towards said upper side 21 the shape of stripes with an aspect ratio, defined as the length of the stripes divided by the width of the stripes, ranging from 5 to 200.

Figure 4:
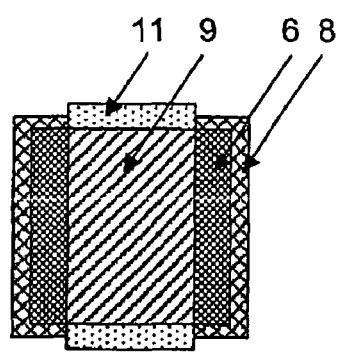

FIG. 4 shows additional well regions 11 which are formed on the end parts of the active cell 5. Their width is smaller than the width of the channel well region 6. The third layer 8 should fully or at least partially surround the channel well region 6. This design is suitable for cell type layout designs, which means that the channel well regions 6 have on the side towards said upper side 21 an aspect ratio defined as the length of the channel well regions 6 divided by the their width lower than 5.

Figure 5:
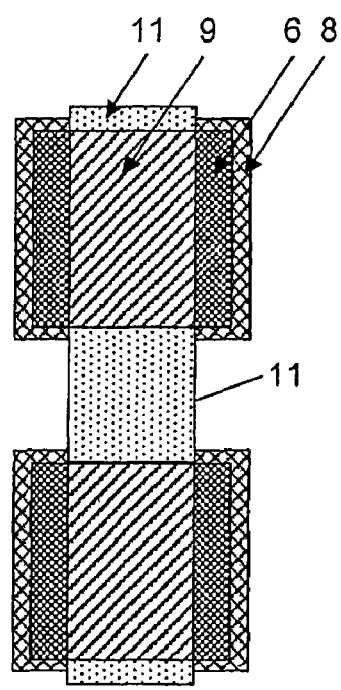

As shown in FIG. 5 the semiconductor device 1 can comprise two or more active cells 5 which are arranged in columns. Two adjacent active cells 5 have one common additional well region 11. The third layer 8 should fully or at least partially surround the channel well region 6. This design is suitable for cell type layout designs.

Figure 6:
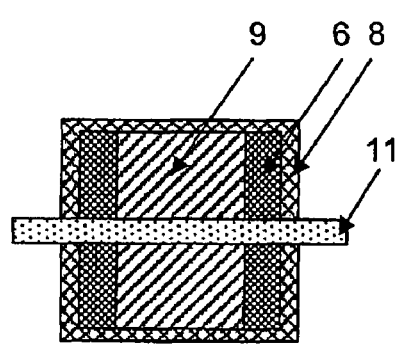

FIG. 6 shows another embodiment of the invention in which an additional well region 11 is formed in the middle part of the active cell 5. This design has very low on-state losses because for each active cell only one additional well region 11 is needed and, therefore, the area of the additional well regions 11 is small. This design is suitable for stripe type layout designs.

Figure 7:
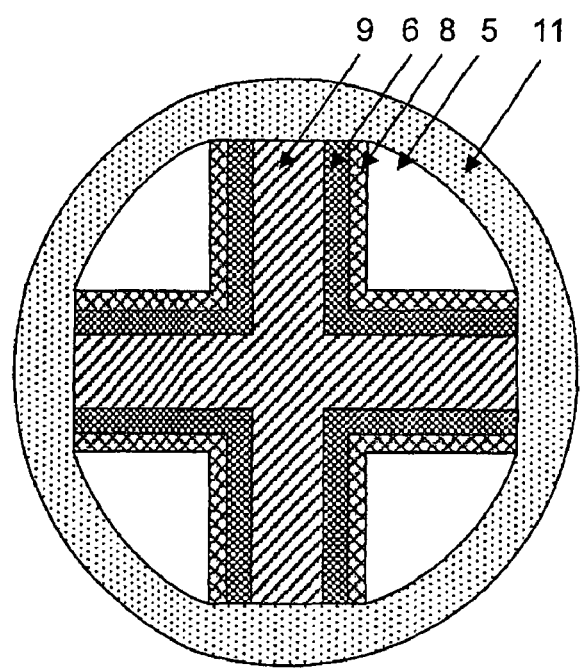

FIG. 7 shows a circular active cell 5 in which the emitter electrode 9 contacts the channel well region 6 on an area in the form of a cross in the middle part of the active cell 5. The channel well region 6 is formed adjacent to the contact area of the emitter electrode 9, embedded by the third layer 8. The additional well regions 11 are formed as a ring around the active cell 5.

In the embodiments elaborated above the insulation layer is oriented planar, i.e. parallel to the upper side 21. It is also possible to apply the invention to IGBTs with trench designs in which insulation layers 41 and gate electrodes 4 are oriented perpendicular to the upper side 21 and adjacent to the source regions 7, and with the channel well region 6 and the third layer 8 being arranged as planar layers between the source regions 7 and the first layer 2.

In another embodiment of the invention the following design consideration are taken into account depending on the energy that needs to be absorbed by the device in terms of stray inductance, active area, current and voltages applied:
the ratio of the area of the additional well regions 11 to the total area of the semiconductor device is chosen accordingly for maximum utilization of active cell area and hole drainage during on-state and during turn-off. This ratio can range from 0.01 (1 percent) to 0.1 (10 percent). This takes into account the widths of the additional well regions 11, which can be chosen anywhere between 1 to 1000 µm (micrometers) depending on the design layout. If the area ratio is below a value of 0.1, then the hole drain effect will not become apparent in the on-state of the IGBT. Hence, a small area of the additional well regions 11 will not affect the carrier profile noticeably, resulting in low on-state losses.

When the semiconductor device is turned off a large proportion of the turn-off current flows mainly through the additional well regions 11 and not through the active cell 5. This is dependent on the area or the number of the enhanced avalanche locations (peripheries of the additional well region 11) and the design of the additional well region 11 from the feature above, taking into account the required power dissipation for a given device. Typical ratio values for the two current paths (i.e. the ratio between the current through the additional well region 11 and the active cell current) are between 1 and 3.

In another embodiment of the invention the channel well regions 6 have on the side towards said upper side 21 the shape of stripes with an aspect ratio, defined as the length of the stripes divided by the width of the stripes, ranging from 5 to 200. All channel well regions 6 within the semiconductor device 1 are arranged parallel to each other, and the additional well regions 11 are aligned perpendicular to the long side of the channel well regions 6. In order not to affect the carrier profile noticeably, resulting in excessive on-state losses, the ambipolar diffusion length must be taken into account as explained below, therefore, the additional well regions 11 can have a width ranging from 2 to 200 µm, and they are spaced apart between 50 and 2000 µm.

In another embodiment of the invention the additional well regions 11 have on the side towards the upper side 21 the shape of stripes and are arranged parallel to each other. The additional well regions 11 are electrically connected to the emitter electrodes 9 through electrically conductive contacts located in the channel well regions 6 in order to provide a path for the holes during turn-off for increased SOA. These contacts reach into the additional well regions 11 by at most 10 µm.

The additional well regions 11 can be distributed uniformly or randomly across the semiconductor device area. However, the additional well regions 11 must have minimum interaction with the active cells 5 during on-state. Thus the distance d of the active cells 5 between any additional well regions 11 in FIG. 2 must be larger than the ambipolar diffusion length $L_a = \sqrt{\tau D_a}$, which is dependent on the lifetime $\tau$ and diffusion constant $D_a$ for the excess minority carriers. Typical values for $L_a$ range between 10 µm up to 200 µm (micrometers). Therefore, for optimum performance, the distance d will range between 50 µm up to 2000 µm (micrometers).

Figure 8:
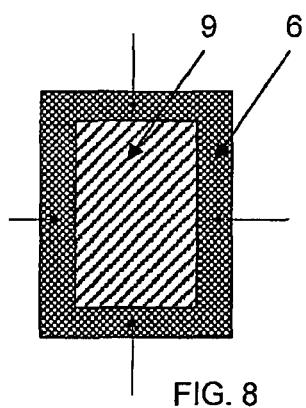
FIGS. 8 and 9 show the principles of operation of IGBTs according to the prior art.
Figure 9:
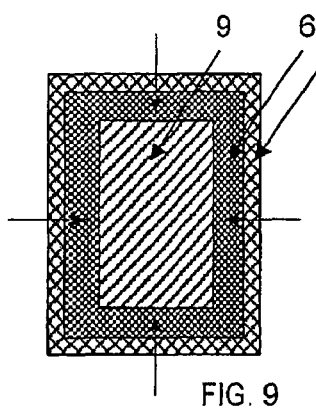
Figure 10:
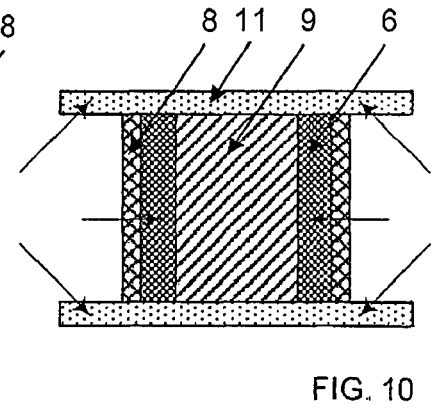
FIG. 10 shows the principles of operation of IGBTs according to the inventive IGBT of FIG. 3.

FIG. 8 to FIG. 10 schematically show three IGBT cells with different RBSOA capabilities during turn-off. For higher clarity of the figures the source regions 7 are not shown in FIG. 8 to FIG. 10. FIG. 8 shows a standard IGBT cell with a p channel well region, thus having a rather poor RBSOA capability with a low critical latch up current (e.g. 100 A). This kind of IGBT device fails as soon as the total turn-off current, which is equal to the total active cell current $I_c$, reaches the critical latch-up current (device fails at $I=I_c=100$ A). FIG. 9 shows a standard IGBT cell with an additional deep n layer 8 surrounding the p type channel well region 6, having an improved RBSOA capability with a higher critical latch up current (e.g. 200 A). Nevertheless, this kind of IGBT still fails when the total turn-off current reaches the critical latch up current (device fails at $I=I_c=200$ A). The inventive IGBT cell shown in FIG. 10 has an additional deep n layer 8 just like the device in FIG. 9 but is further enhanced with additional well regions 11, further improving the RBSOA capability. The total turn-off current splits into the active cell current $I_c$ and the current $I_p$ flowing through the additional well regions. Therefore, having the same critical latch up current as device b) (e.g. 200 A), the inventive IGBT device fails when the active cell current reaches the critical latch up current. The critical total turn-off current is much higher than the critical turn-off current of devices A and B (e.g. $I_p=2*I_c$, device fails at $I=I_c+I_p=3*I_c=600$ A).

LIST OF DESIGNATIONS 1 semiconductor device
2 first layer
21 upper side
3 second layer
31 lower side
4 gate electrode
41 insulation layer
5 active semiconductor cell
6 channel well region
7 source region
8 third layer
9 emitter electrode
10 collector electrode
11 additional well region

The invention claimed is:

1. An insulated gate semiconductor device with a first layer of a first conductivity type, said first layer having an upper side, and with insulated gate electrodes being formed on said upper side, and with an active semiconductor cell comprising:
a part of said first layer,
a channel well region of a second conductivity type,
source regions of the first conductivity type having a doping density higher than said first layer,
a second layer of the first conductivity type having a higher doping density than said first layer, and
emitter electrodes which are formed on said upper side and contact the source regions and the channel well region,
wherein the channel well region, the source regions and the second layer being formed within said first layer adjacent to said upper side,
wherein the second layer at least partially separating the channel well region and said first layer, and
wherein the semiconductor device further comprises additional well regions of the second conductivity type which are formed adjacent to the channel well region outside the active semiconductor cell within said first layer, said additional well regions are electrically connected through said channel well regions to the emitter electrodes, and when a gate electrode or a source region is formed above an additional well region then only said gate electrode or only said source region is formed above the additional well region so that no conductive channel is formed, wherein said additional well regions have at least one of the following features:
said additional well regions having a higher doping density than the channel well region, or
the semiconductor device having a junction between the first layer and the additional well regions which is deeper than the junction between the first layer and the channel well region.

2. The semiconductor device as in claim 1, wherein the semiconductor device has a junction between the first layer and the additional well regions which is deeper than the junction between the first layer and the channel well region.

3. The semiconductor device as in claim 2, wherein the channel well regions have the shape of stripes with an aspect ratio, defined as the length of the stripes divided by the width of the stripes, ranging from 5 to 200, that all channel well regions within the semiconductor device are arranged parallel to each other, and that the additional well regions are aligned perpendicular to the long side of the channel well regions.

4. The semiconductor device as in claim 2, wherein the additional well regions have the shape of stripes and are arranged parallel to each other, that the additional well regions have a width ranging from 2 to 200 micrometers, and that the additional well regions are spaced apart between 50 and 2000 micrometers.

5. The semiconductor device as in claim 2, wherein the additional well regions have the shape of stripes and are arranged parallel to each other, that the additional well regions are electrically connected to the emitter electrodes through electrically conductive contacts located in the channel well regions.

6. The semiconductor device as in claim 1, wherein the ratio of the total area of all additional well regions of the semiconductor device to the total semiconductor device area ranges from 0.01 to 0.10.

7. The semiconductor device as in claim 6, wherein the channel well regions have the shape of stripes with an aspect ratio, defined as the length of the stripes divided by the width of the stripes, ranging from 5 to 200, that all channel well regions within the semiconductor device are arranged parallel to each other, and that the additional well regions are aligned perpendicular to the long side of the channel well regions.

8. The semiconductor device as in claim 6, wherein the additional well regions have the shape of stripes and are arranged parallel to each other, that the additional well regions have a width ranging from 2 to 200 micrometers, and that the additional well regions are spaced apart between 50 and 2000 micrometers.

9. The semiconductor device as in claim 6, wherein the additional well regions have the shape of stripes and are arranged parallel to each other, that the additional well regions are electrically connected to the emitter electrodes through electrically conductive contacts located in the channel well regions.

10. The semiconductor device as in claim 1, wherein the channel well regions have the shape of stripes with an aspect ratio, defined as the length of the stripes divided by the width of the stripes, ranging from 5 to 200, that all channel well regions within the semiconductor device are arranged parallel to each other, and that the additional well regions are aligned perpendicular to the long side of the channel well regions.

11. The semiconductor device as in claim 10, wherein the additional well regions have the shape of stripes and are arranged parallel to each other, that the additional well regions have a width ranging from 2 to 200 micrometers, and that the additional well regions are spaced apart between 50 and 2000 micrometers.

12. The semiconductor device as in claim 10, wherein the additional well regions have the shape of stripes and are arranged parallel to each other, that the additional well regions are electrically connected to the emitter electrodes through electrically conductive contacts located in the channel well regions.

13. The semiconductor device as in claim 1, wherein the additional well regions have the shape of stripes and are arranged parallel to each other, that the additional well regions have a width ranging from 2 to 200 micrometers, and that the additional well regions are spaced apart between 50 and 2000 micrometers.

14. The semiconductor device as in claim 13, wherein the additional well regions have the shape of stripes and are arranged parallel to each other, that the additional well regions are electrically connected to the emitter electrodes through electrically conductive contacts located in the channel well regions.

15. The semiconductor device as in claim 1, wherein the additional well regions have the shape of stripes and are arranged parallel to each other, that the additional well regions are electrically connected to the emitter electrodes through electrically conductive contacts located in the channel well regions.

* * * * *